US011037895B2

(12) United States Patent
Niitsu et al.

(10) Patent No.: US 11,037,895 B2
(45) Date of Patent: Jun. 15, 2021

(54) ELECTRONIC COMPONENT

(71) Applicant: Molex, LLC, Lisle, IL (US)

(72) Inventors: Toshihiro Niitsu, Lisle, IL (US); Yoshiteru Nogawa, Lisle, IL (US)

(73) Assignee: Molex, LLC, Lisle, IL (US)

( * ) Notice: Subject to any disclaimer, the term of this patent is extended or adjusted under 35 U.S.C. 154(b) by 14 days.

(21) Appl. No.: 16/297,764

(22) Filed: Mar. 11, 2019

(65) Prior Publication Data

US 2019/0326238 A1 Oct. 24, 2019

(30) Foreign Application Priority Data

Apr. 24, 2018 (JP) .............................. JP2018-083350

(51) Int. Cl.
H01L 23/00 (2006.01)
H01L 23/64 (2006.01)
H01L 23/498 (2006.01)
H01L 23/28 (2006.01)

(52) U.S. Cl.
CPC .............. *H01L 24/06* (2013.01); *H01L 23/28* (2013.01); *H01L 23/49838* (2013.01); *H01L 23/647* (2013.01); H01L 2224/73215 (2013.01)

(58) Field of Classification Search
None
See application file for complete search history.

(56) References Cited

U.S. PATENT DOCUMENTS

| 2006/0220783 A1 | 10/2006 | Kuriyama |
| 2013/0181792 A1 | 7/2013 | Ng et al. |
| 2015/0187738 A1* | 7/2015 | Tan ...................... H01L 23/481 |
| | | 257/676 |

FOREIGN PATENT DOCUMENTS

| CN | 1355417 A | 6/2002 |
| CN | 101038808 A | 9/2007 |
| CN | 101065842 A | 10/2007 |
| CN | 101097906 A | 1/2008 |
| CN | 101978482 A | 2/2011 |
| CN | 201910306 U | 7/2011 |
| CN | 105390220 A | 3/2016 |
| JP | 1991-024271 U | 3/1991 |
| JP | 1993-291320 A | 11/1993 |
| JP | 1995-085910 A | 3/1995 |
| JP | 2007150144 A | 6/2007 |
| JP | 5020822 B2 | 9/2012 |
| JP | 2014-208902 A | 11/2014 |
| KR | 100722629 B1 | 5/2007 |
| WO | 2014132826 A1 | 9/2014 |

* cited by examiner

*Primary Examiner* — Nicholas J Tobergte
*Assistant Examiner* — Kien C Ly

(57) ABSTRACT

An electronic component is provided that includes multiple conductive terminals and an insulator integrated with the conductive terminals. A leg part possessed by one of the conductive terminals and a leg part possessed by another one of the conductive terminals are disposed so as to vertically overlap each other. The leg part possessed by one of the conductive terminals and the leg part possessed by another one of the conductive terminals have different lengths, and the tip of the shorter leg part of the two is covered by a thick part of the insulator.

9 Claims, 14 Drawing Sheets

ELECTRONIC COMPONENT

RELATED APPLICATIONS

This application claims priority to Japanese Application No. 2018-083350, filed on Apr. 24, 2018, which is incorporated by reference in its entirety.

TECHNICAL FIELD

The present disclosure relates to an electronic component.

BACKGROUND ART

Conventionally, a chip-like electronic component including various elements such as a resistor is mounted on a substrate such as a printed circuit board (for example, see Patent Literature 1.).

FIGS. 14A and 14B are diagrams illustrating a conventional electronic component. Note that, in the drawing, FIG. 14A is a perspective view of an electronic component, while FIG. 14B is a perspective view of a conductive plate.

In the drawing, 801 is a jumper chip which is one type of electronic component and is mounted on the surface of a substrate, not illustrated. The jumper chip 801 is provided with a plurality of conductive plates 851, along with a housing 811 for enclosing and sealing a portion near the center of the conductive plate 851.

The conductive plates 851 are elongated plate members composed of a conductive metal such as a copper alloy and are provided with an L-shaped attachment end part 852 on both ends as illustrated in the drawing. Then, the plurality of the conductive plates 851 (4 in the example illustrated in the drawing) are arranged side by side so as to be parallel to each other. Furthermore, the housing 811 is composed of an insulative resin material, and holds and fixes the conductive plate 851, which is arranged side by side.

The jumper chip 801 is mounted on the surface of a substrate by each attachment end part 852 being fixed to a conductive wire formed on the surface of the substrate, not illustrated, by means such as soldering and the like.

Patent Literature 1: Japanese Utility Model H3-024271

SUMMARY

However, in conventional electronic components, although the conductive plate 851 is held by the housing 811, since the housing 811 only fixes a resin to form a predetermined shape, it is difficult to strictly maintain the gap between adjacent conductive plates 851 to a predetermined size, in addition to also being difficult to attach a shield plate to the conductive plate 851 to maintain a predetermined gap therebetween. Recently, as various electrical devices and electronic devices have come to be miniaturized, electronic components implemented on a substrate mounted on an electrical device and an electronic device have also come to be miniaturized; however, even in the case of an electronic component having a simple structure such as the jumper chip 801, when miniaturized, since it becomes difficult to strictly manage the dimensions of the housing 811 formed by solidifying the resin, it becomes further difficult to strictly maintain the gap between adjacent conductive plates 851 as well as the gap between the shield plate and the conductive plate 851 to a predetermined minute dimension.

Here, it is an object of the present disclosure to solve the conventional problems described above by providing an electronic component that can reliably exhibit the desired performance even when miniaturized, in addition to having high reliability, low manufacturing cost, and high durability.

Consequently, an electronic component includes: multiple conductive terminals; and an insulator integrated with the conductive terminals, wherein a leg part possessed by one of the conductive terminals and a leg part possessed by another one of the conductive terminals are disposed so as to vertically overlap each other, the leg part possessed by one of the conductive terminals and the leg part possessed by the other one of the conductive terminals have different lengths, and the tip of the shorter leg part of the two is covered by a thick part of the insulator.

Further, in another electronic component, a protrusion plate of the insulator is disposed between the leg parts which are disposed so as to vertically overlap each other, with the thick part formed at the tip of the protrusion plate.

Further, in still another electronic component, one of the conductive terminals is a first conductive terminal, wherein the first conductive terminal includes a flat plate part as well as auxiliary leg parts serving as a plurality of shorter leg parts of the two extending forward and backward from the flat plate part, wherein the other one of the conductive terminals is a second conductive terminal and includes a main body as well as multiple leg parts extending forward and backward from the main body, wherein at least part of the main body and the flat plate part are disposed so as to vertically overlap each other.

Further, in still another electronic component, the first conductive terminal includes multiple first leg parts extending forward and backward from the flat plate part, with the first leg parts connected to a ground wire.

Further, still another electronic component further includes: a conductive plate integrated with the insulator, wherein the conductive plate includes a projection and an eaves part, the projection contacts the flat plate part, and at least part of the main body is disposed on the eaves part on the opposite side of the flat plate part from the main body so as to vertically overlap each other.

Further, in still another electronic component, at least part of the insulator is present between the main body and the flat plate part as well as between the main body and the eaves part.

Even when the electronic component is miniaturized, the desired performance can be reliably exhibited, with the reliability and durability improved at a reduced manufacturing cost.

BRIEF DESCRIPTION OF DRAWINGS

FIGS. 1A and 1B are perspective views illustrating an electronic component according to the present embodiment, wherein FIG. 1A is a perspective view seen from above, while FIG. 1B is a perspective view seen from below.

FIGS. 2A and 2B are a first two-face view of the electronic component according to the present embodiment, wherein FIG. 2A is a top view, while FIG. 2B is a side view.

FIGS. 3A and 3B are a second two-face view of the electronic component according to the present embodiment, wherein FIG. 3A is a bottom view, while FIG. 3B is a front view.

FIGS. 4A and 4B are perspective views illustrating the electronic component according to the present embodiment with an adhesive sheet removed therefrom, wherein FIG. 4A is a perspective view seen from above, while FIG. 4B is a perspective view seen from below.

FIGS. 5A and 5B are a first two-face view illustrating the electronic component according to the present embodiment with the adhesive sheet removed therefrom, wherein FIG. 5A is a top view, while FIG. 5B a side view.

FIGS. 6A and 6B are a second two-face view illustrating the electronic component according to the present embodiment with the adhesive sheet removed therefrom, wherein FIG. 6A is a bottom view, while FIG. 6B is a front view.

FIGS. 9A and 9B are perspective views illustrating a first conductive terminal according to the present embodiment, wherein FIG. 9A is a perspective view seen from above, while FIG. 9B is a perspective view seen from below.

FIGS. 10A and 10B are perspective views illustrating a second conductive terminal according to the present embodiment, wherein FIG. 10A is a perspective view seen from above, while FIG. 10B is a perspective view seen from below.

FIGS. 11A and 11B are perspective views illustrating a second shell according to the present embodiment, wherein FIG. 11A is a perspective view seen from above, while FIG. 11B is a perspective view seen from below.

FIGS. 12A and 12B are perspective views with the first conductive terminal, the second conductive terminal, and the second shell according to the present embodiment combined therein, wherein FIG. 12A is a perspective view seen from above, while FIG. 12B is a perspective view seen from below.

FIGS. 13A and 13B are perspective views illustrating a housing according to the present embodiment, wherein FIG. 13A is a perspective view seen from above, while FIG. 13B is a perspective view seen from below.

FIGS. 14A and 14B are diagrams illustrating a conventional electronic component, wherein FIG. 14A is a perspective view of the electronic component, while FIG. 14B is a perspective view of a conductive plate.

DETAILED DESCRIPTION OF THE PREFERRED EMBODIMENTS

Figure 1A:
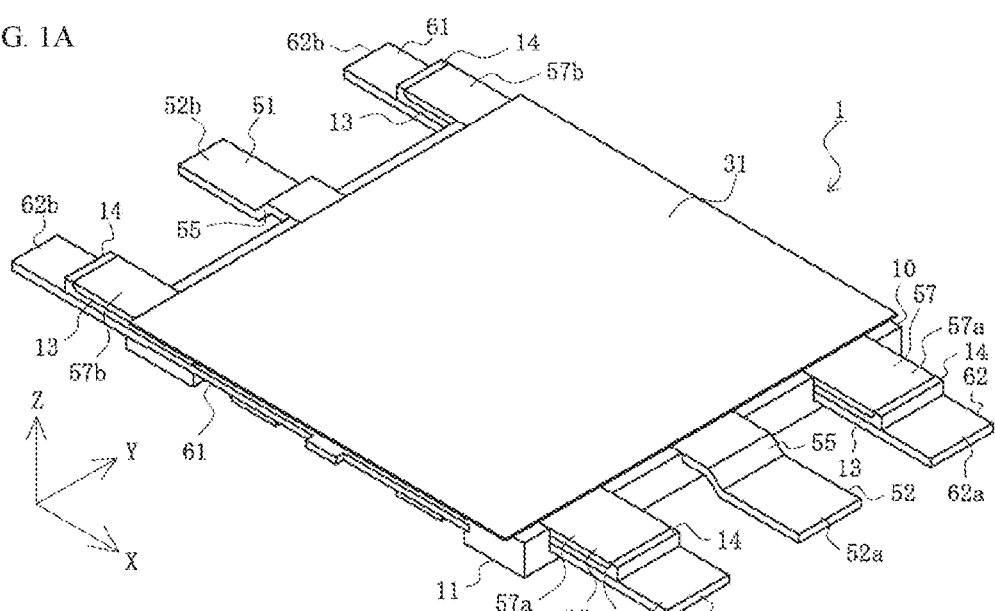

An embodiment will be described in detail below with reference to the drawings.

In the figures, 1 is an electronic component according to the present embodiment, for example, a resistance network also referred to as a network resistance and a resistance array, and may be a jumper chip including multiple jumper wires, or may be any kind, but will hereinafter be described as a chip type electronic component which includes a first conductive terminal 51 and a second conductive terminal 61 as conductive terminals and functions as the resistance network. Furthermore, the electronic component 1 may be used in a variety of equipment and devices and the like such as fabrication electronics and electronic equipment, household electronics and electronic appliances, computers, and transmission equipment; however, here, for convenience of description, it is assumed that it is connected to a substrate such as a printed circuit board used in electronic equipment and the like, a flexible flat cable (FFC), a flexible circuit board (FPC), and the like.

Note that, in the present embodiment, expressions indicating directions such as up, down, left, right, front, and back that are used to describe the configuration and operation of each part included in the electronic component 1 are relative and not absolute and are suitable when each part included in the electronic component 1 is in the position illustrated by the drawings; however, when the position of each part included in the electronic component 1 is changed, then they should be interpreted in accordance with changes corresponding to the changes in positions.

In the example illustrated in the figures, the electronic component 1 according to the present embodiment includes a substantially rectangular flat plate shaped component main body 10, as well as the first conductive terminal 51 and the second conductive terminal 61 which respectively include, as leg parts, a first leg part 52 and a second leg part 62 that are exposed on both sides of this component main body 10 in the longitudinal direction (X-axis direction). Moreover, the component main body 10 includes a housing 11 as an insulator consisting of an insulative material such as heat resistant synthetic resin, a flat plate part 53 of the first conductive terminal 51 disposed on the upper side (Z-axis positive direction side) of this housing 11 to function as a first shell, and a second shell 71 as a conductive plate disposed on the lower side (Z-axis negative direction side) of the housing 11. Note that at least part of the lower surface of this second shell 71 is covered by a bottom 15 of the housing 11. The housing 11 is a member which is integrated and molded with the first conductive terminal 51, the second conductive terminal 61, and the second shell 71, by insert molding (overmolding) involving filling a molding die with a dielectric material such as synthetic resin, with the first conductive terminal 51, the second conductive terminal 61, and the second shell 71 placed in the die. In other words, the first conductive terminal 51, the second conductive terminal 61, and the second shell 71 are integrated with the housing 11 so as to configure the component main body 10.

Further, the overall upper surface of this component main body 10 is covered by an adhesive sheet 31 consisting of an insulative adhesive material such as adhesive resin. This adhesive sheet 31 is a substantially rectangular flat plate shaped member, wherein the thickness cut from a material consisting of the insulative adhesive is, for example, approximately 10 to 11 mm. Note that the adhesive sheet 31 can also be removed if not required. The state with the adhesive sheet 31 removed therefrom is illustrated in FIGS. 4A to 6B.

Moreover, the number and arrangement of the first conductive terminal 51 and the first leg part 52, as well as the second conductive terminal 61 and the second leg part 62, can be optionally set. For convenience of description, the case will hereinafter be described in which one first leg part 52 is disposed in the center on both sides of the component main body 10 in the longitudinal direction, while the second leg part 62 is disposed on both sides of this first leg part 52 in the lateral direction (Y-axis direction). The second conductive terminal 61 is a metallic plate of an elongated belt shaped copper alloy, etc. stretching in the longitudinal direction, with both the front and rear ends thereof serving as the second leg parts 62, each one of which is therefore disposed along both left and right sides of the component main body 10. Moreover, as illustrated in FIGS. 4A, 4B, 5A and 5B, the first conductive terminal 51 is a metallic plate of a copper alloy, etc., wherein each of the base ends of the first leg part 52 extending forward (X-axis positive direction) and backward (X-axis negative direction) is integrally connected in the center in the width direction (Y-axis direction) on the longitudinal ends of a substantially rectangular flat plate part 53 stretching over nearly the entire upper surface of the component main body 10. Further, each of the base ends of an auxiliary leg part 57 as the leg part extending forward and backward is integrally connected at the position corresponding to each second leg part 62 at both ends in the width direction on the longitudinal sides of the flat plate part 53. Each auxiliary leg part 57 is formed so as to have a width shorter than or the same as the corresponding second leg part 62 and disposed at intervals above the corresponding second leg part 62.

Note that in the example illustrated in the figures, a front first leg part 52*a*, a front second leg part 62*a*, and a front auxiliary leg part 57*a*, which are exposed on the front side of the component main body 10, are respectively formed so as to have greater widths than a rear first leg part 52*b*, a rear second leg part 62*b*, and a rear auxiliary leg part 57*b*, which are exposed on the rear side of the component main body 10, wherein the widths of the front first leg part 52*a*, the front second leg part 62*a*, and the front auxiliary leg part 57*a*, as well as the widths of the rear first leg part 52*b*, the rear second leg part 62*b*, and the rear auxiliary leg part 57*b*, are not limited thereto and can be optionally set. Moreover, if the front first leg part 52*a* and the rear first leg part 52*b* are comprehensively described, the description is provided as the first leg part 52, while if the front second leg part 62*a* and the rear second leg part 62*b* are comprehensively described, the description is provided as the second leg part 62, and if the front auxiliary leg part 57*a* and the rear auxiliary leg part 57*b* are comprehensively described, the description is provided as the auxiliary leg part 57.

Because this auxiliary leg part 57 is shorter than the second leg part 62, the part having a predetermined length from the tip in this second leg part 62 is exposed with the upper part thereof not covered by the auxiliary leg part 57, with only the upper part of the remaining part covered by the auxiliary leg part 57. In addition, a protrusion plate 13 serving as part of the housing 11 and protruding from the longitudinal end of the housing 11 is present between the second leg part 62 and the auxiliary leg part 57. In this manner, because the second leg part 62 is integrally connected to the auxiliary leg part 57 via the protrusion plate 13, it is sufficiently reinforced so as to improve the strength. Moreover, a thick part 14 is formed at the tip of the protrusion plate 13 such that this thick part 14 covers at least the tip of the auxiliary leg part 57. Therefore, the tip of the auxiliary leg part 57 is protected by the thick part 14 and is not damaged.

In the example illustrated in the figures, a bent part 55 bent in a crank shape is formed partway along the first leg part 52. Consequently, because the height position (position in the Z-axis direction) in the vicinity of the tip of the first leg part 52 can be nearly equal to that in the vicinity of the tip of the second leg part 62, the operation of connecting the vicinity of the tip of the first leg part 52 and the vicinity of the tip of the second leg part 62 to the surface of the same substrate can be easily carried out. Note, the bent part 55 can be appropriately omitted. Moreover, the tip of the first leg part 52 and the tip of the second leg part 62 are directed in the horizontal direction (X-axis direction), while, as required, the halfway of the first leg part 52 and the halfway of the second leg part 62 can also be bent so as to direct the tip of the first leg part 52 and the tip of the second leg part 62 obliquely upward, obliquely downward, or just downward. Further, when the tip of the first leg part 52 and the tip of the second leg part 62 are subjected to gold plating, etc., a coating film consisting of a highly conductive material can also be formed.

Note that the dimensions of the component main body 10 in the X, Y, and Z-axis directions are, for example, desirably 3 to 4 [mm], 2 to 3 [mm], and 0.2 to 0.3 [mm], respectively, the dimensions of the first leg part 52 and the second leg part 62 in the X-axis direction are, for example, desirably 0.7 to 0.9 [mm], and the interval (pitch) between the first leg part 52 and the second leg part 62 is, for example, desirably 0.8 to 1.2 [mm], wherein the dimension of each part of the electronic component 1 can be appropriately changed without being limited thereto.

In addition, in the first conductive terminal 51, for example, the vicinity of the tip of the first leg part 52 is connected to a ground wire (not illustrated) of the substrate, while in the second conductive terminal 61, for example, the vicinity of the tip of the second leg part 62 is connected to a signal line (not illustrated) of the substrate. Moreover, the flat plate part 53 of the first conductive terminal 51 is conducted with the second shell 71 in the component main body 10, and consequently, the flat plate part 53 of the first conductive terminal 51 and the second shell 71 function as EMI shield members for electromagnetically effectively shielding the electronic component 1.

Subsequently, the internal structure of the electronic component 1 will be described.

Figure 1B:
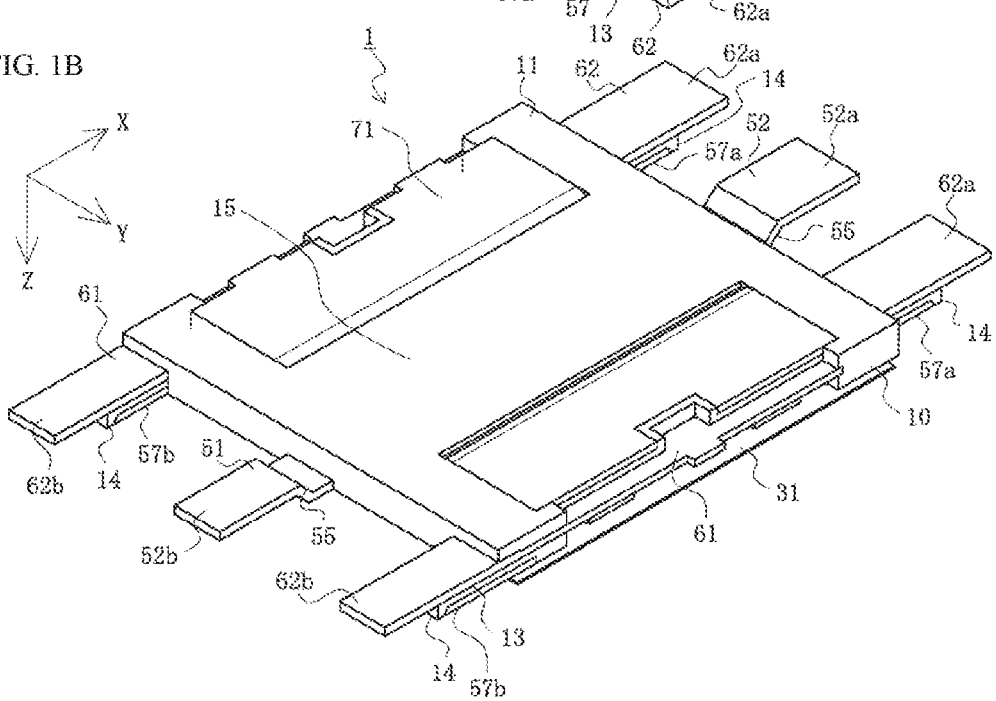
Figure 2A:
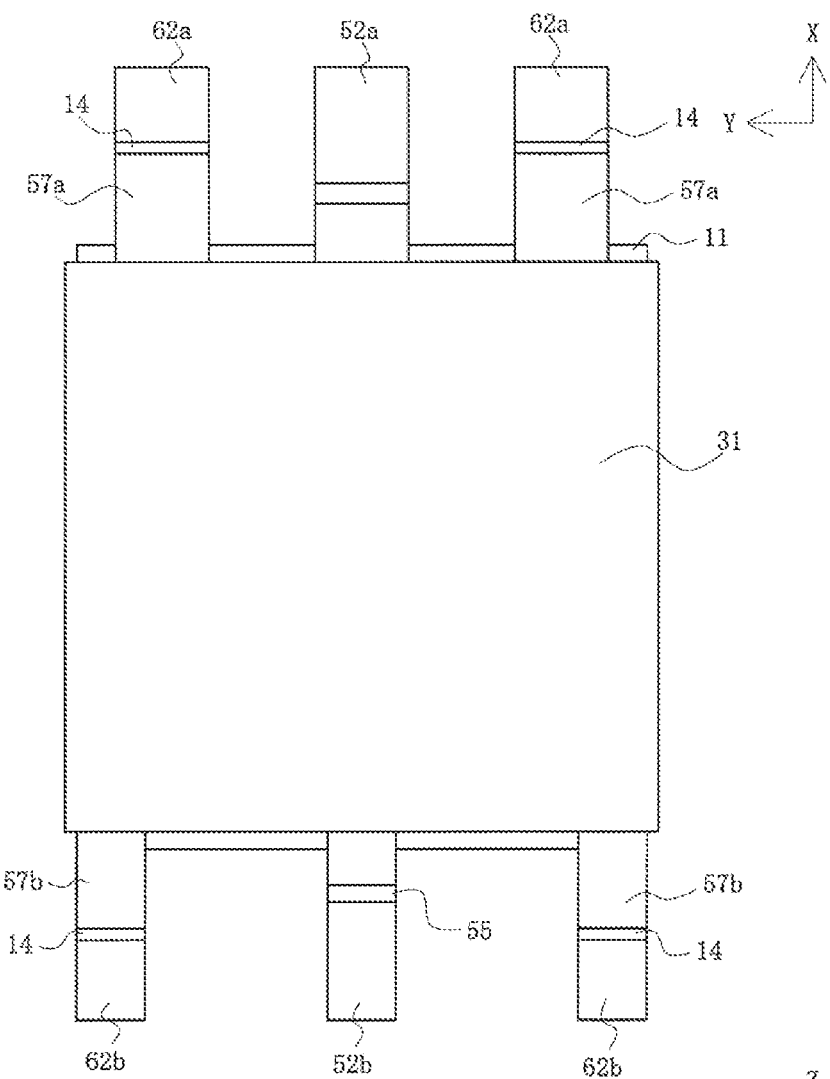
Figure 2B:
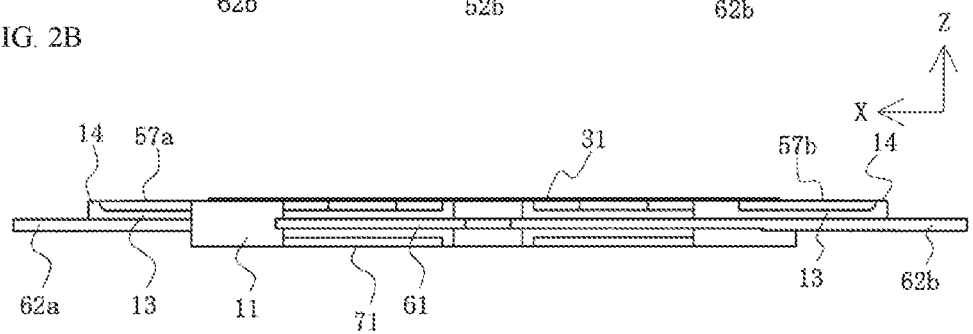
Figure 3A:
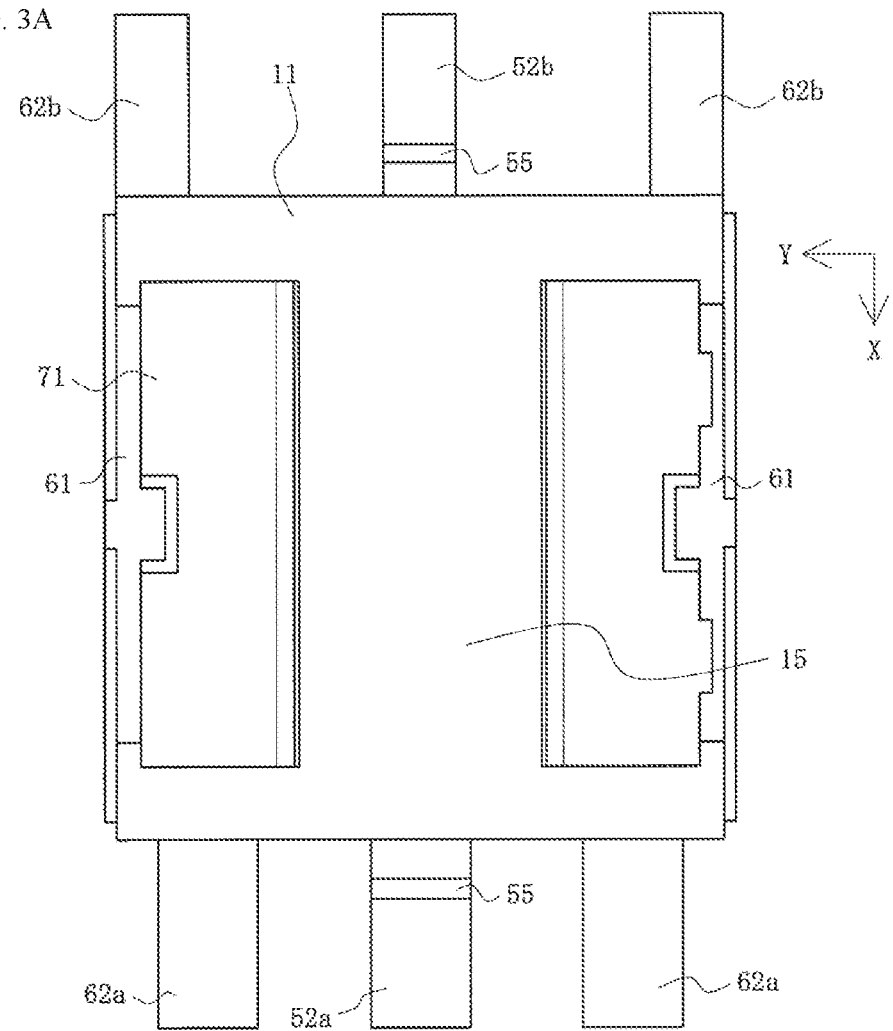
Figure 3B:
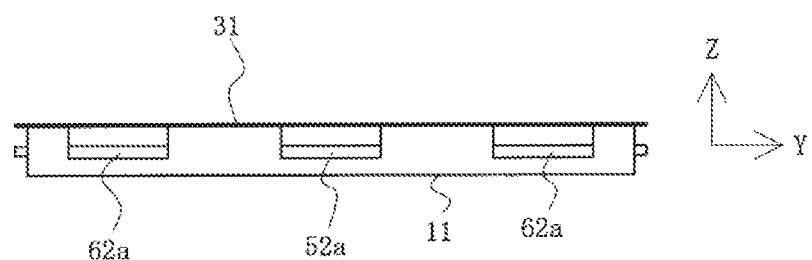
Figure 4A:
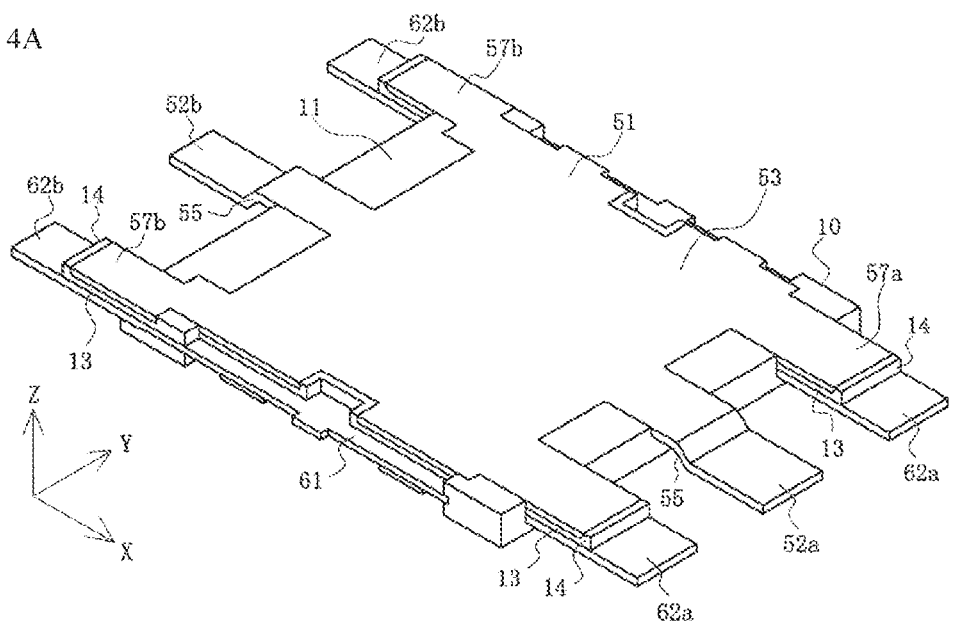
Figure 4B:
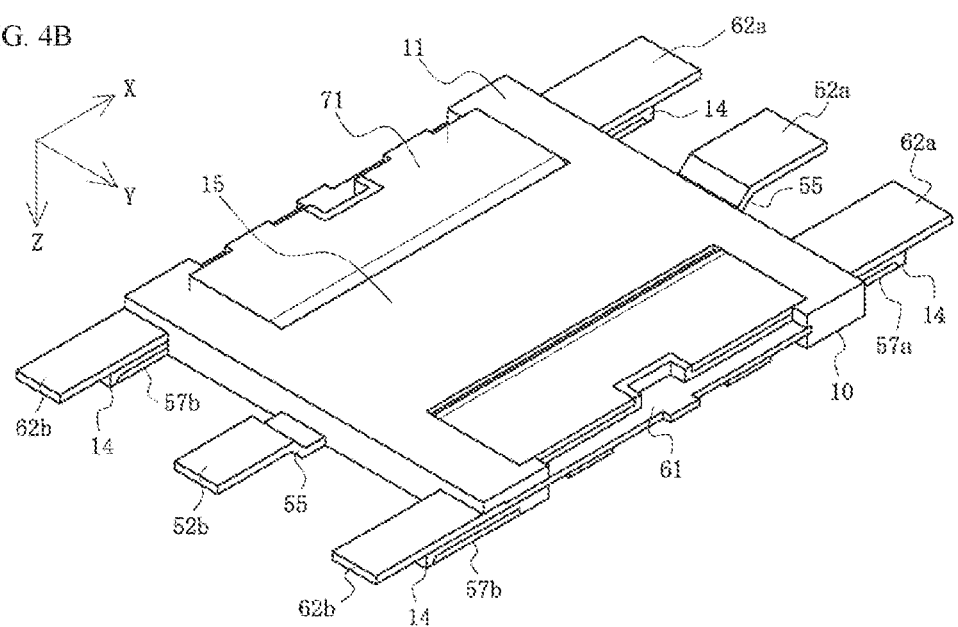
Figure 5A:
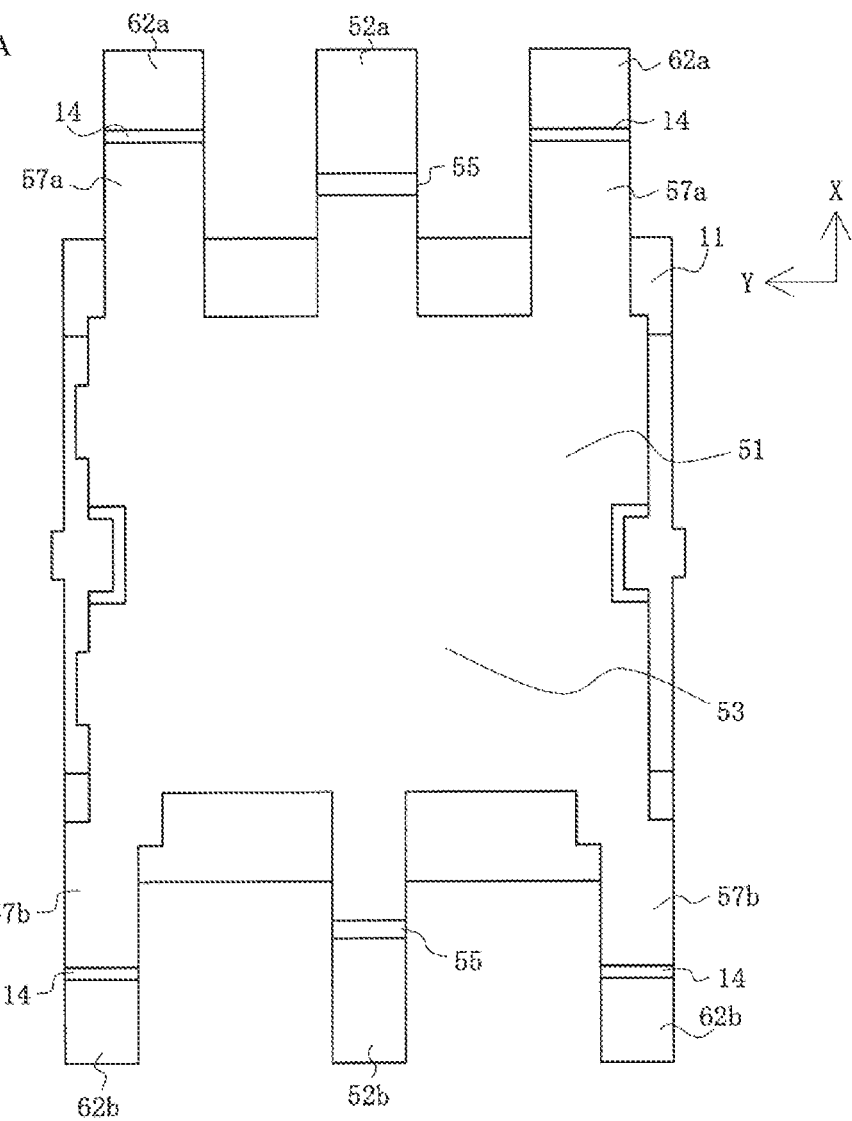
Figure 5B:
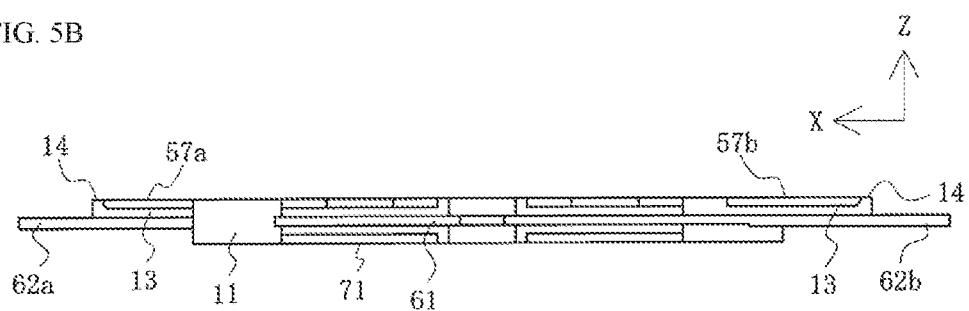
Figure 6A:
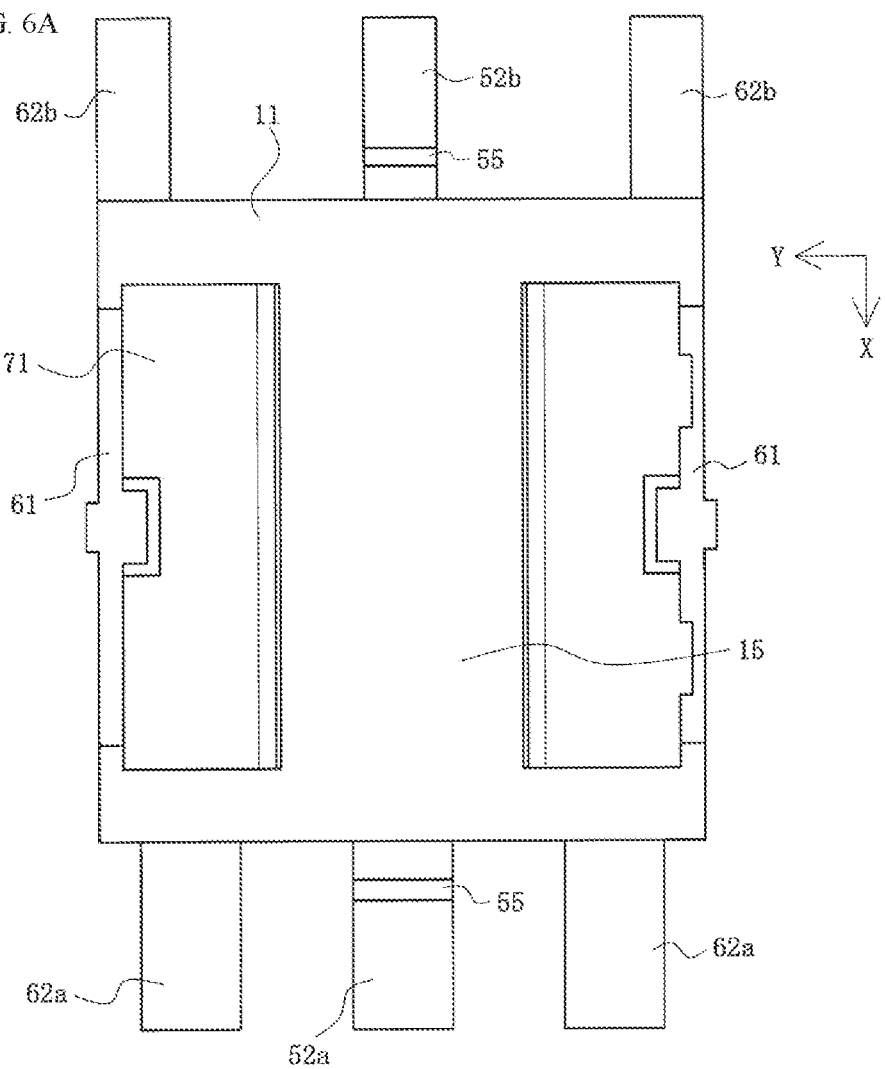
Figure 6B:
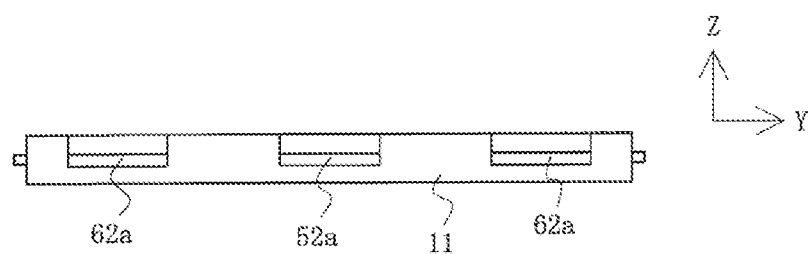
Figure 7:
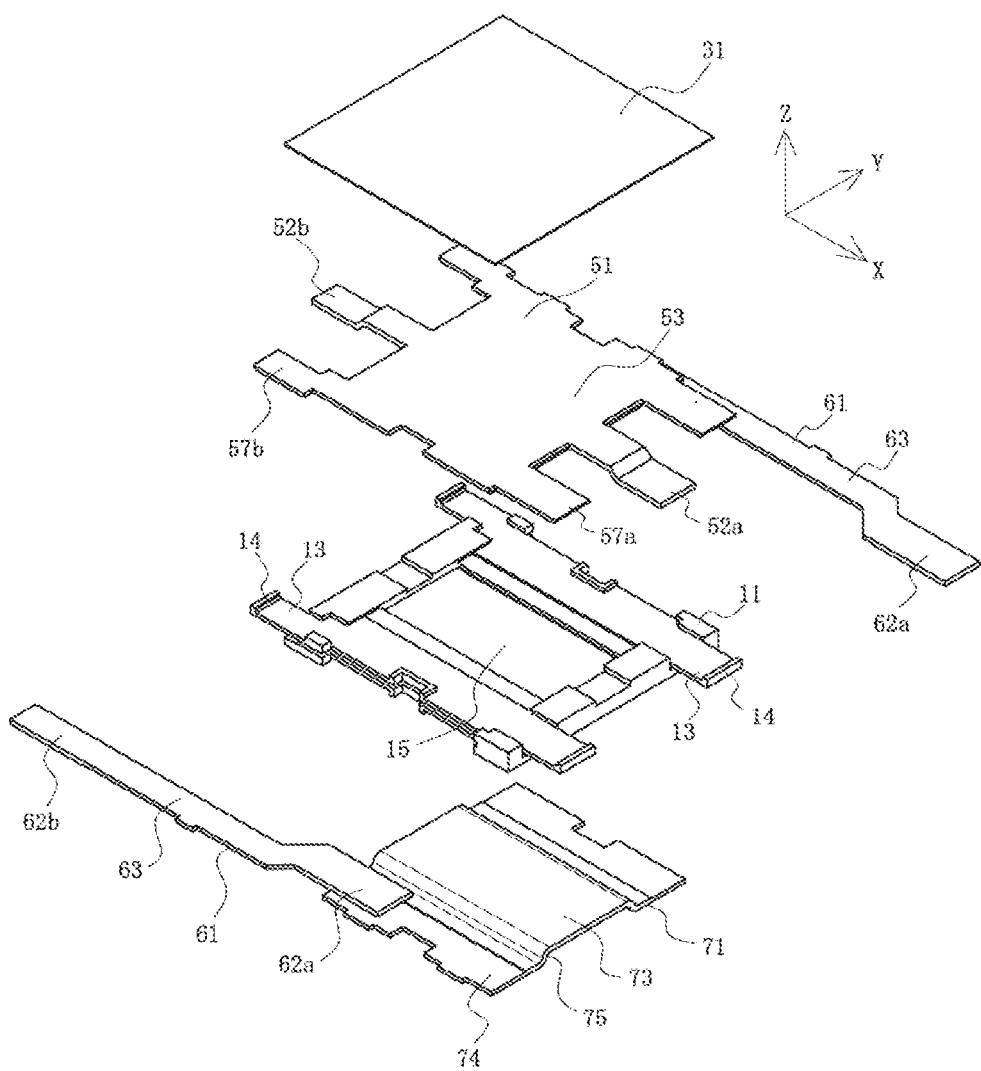
FIG. 7 is an exploded view of the electronic component according to the present embodiment seen from above.
Figure 8:
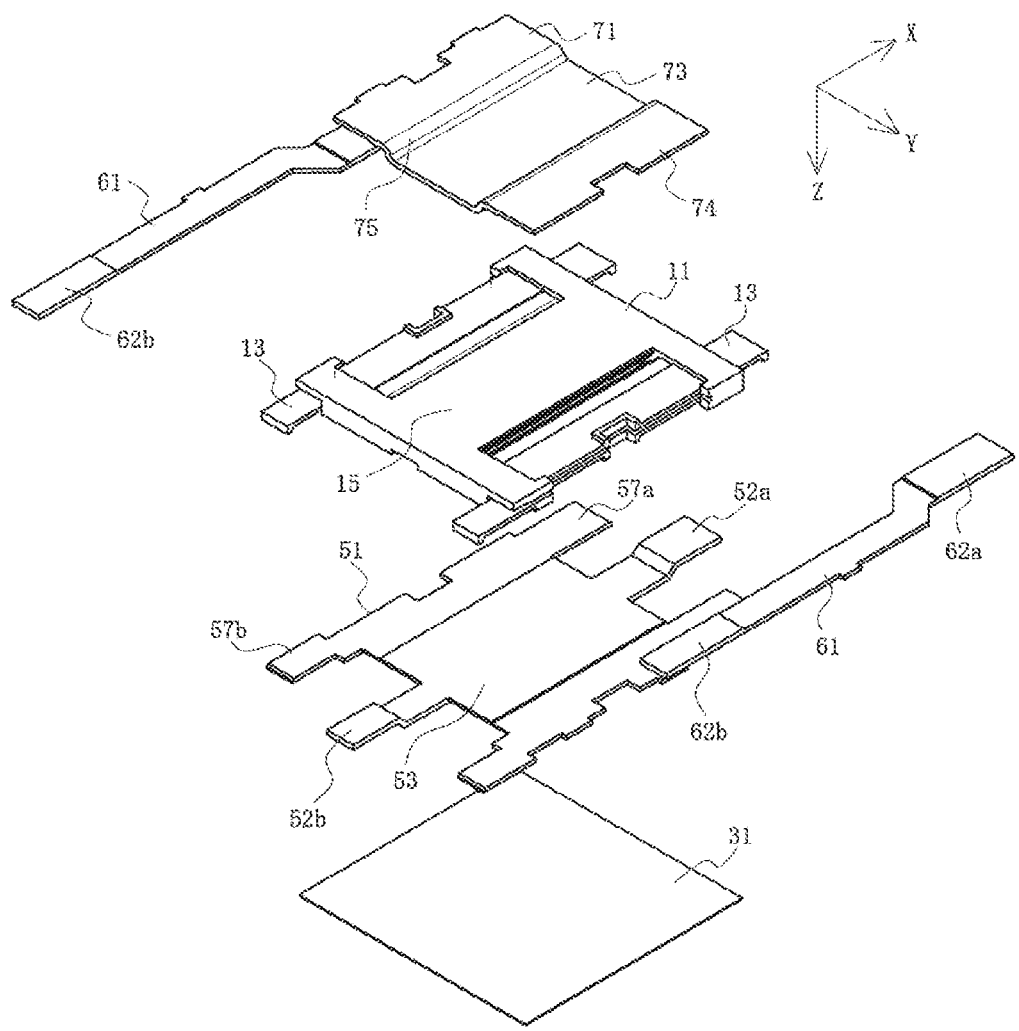
FIG. 8 is an exploded view of the electronic component according to the present embodiment seen from below.
Figure 9A:
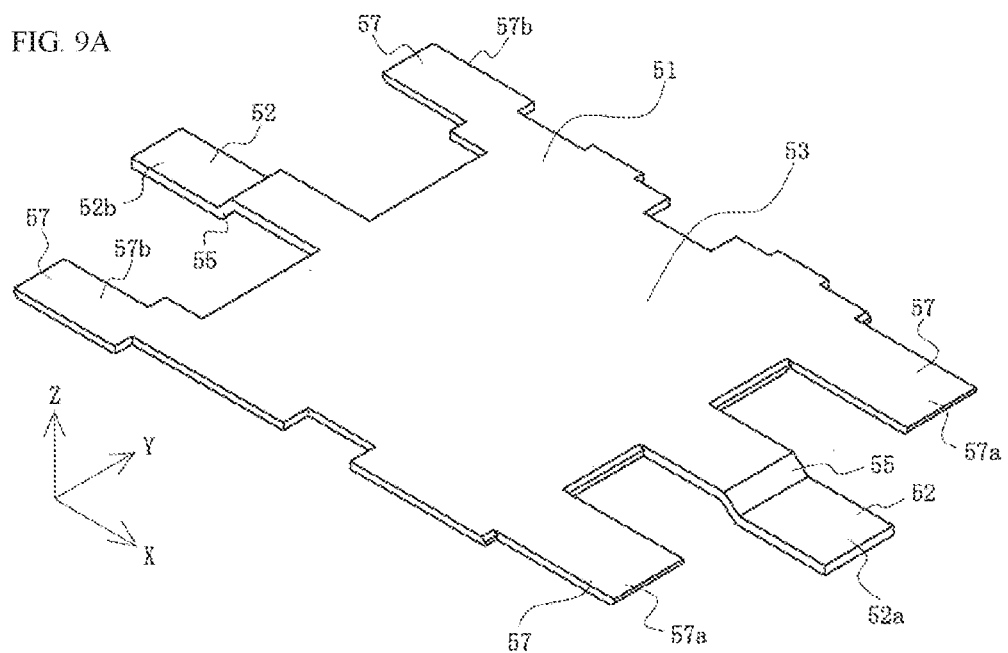
Figure 9B:
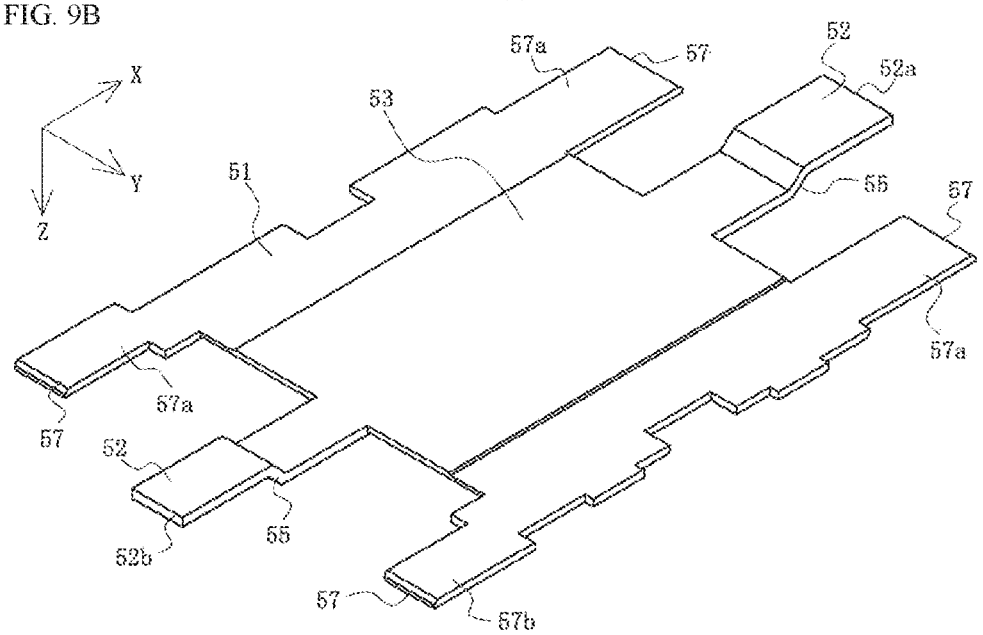
Figure 12A:
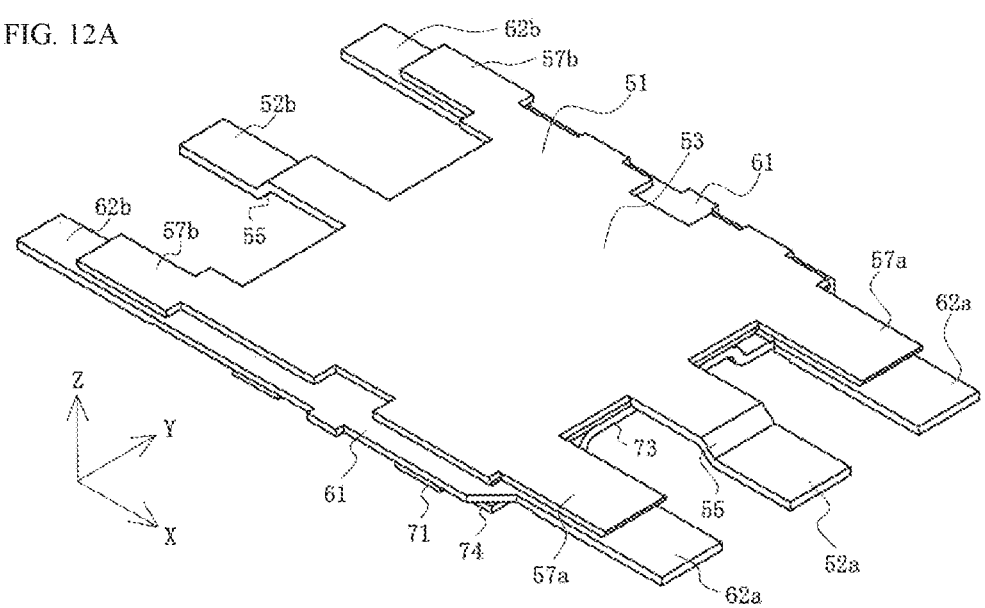
Figure 12B:
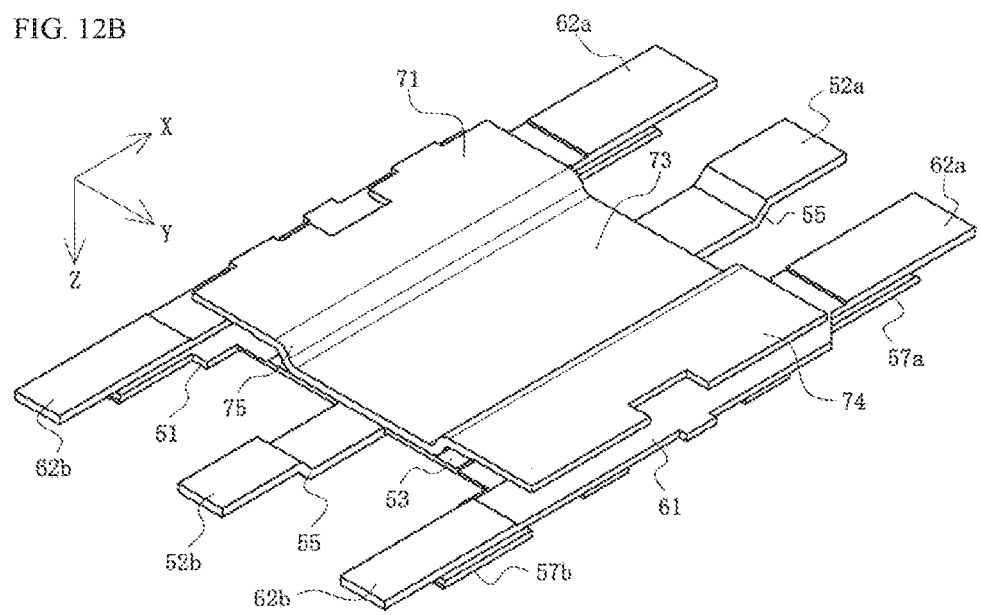
Figure 13A:
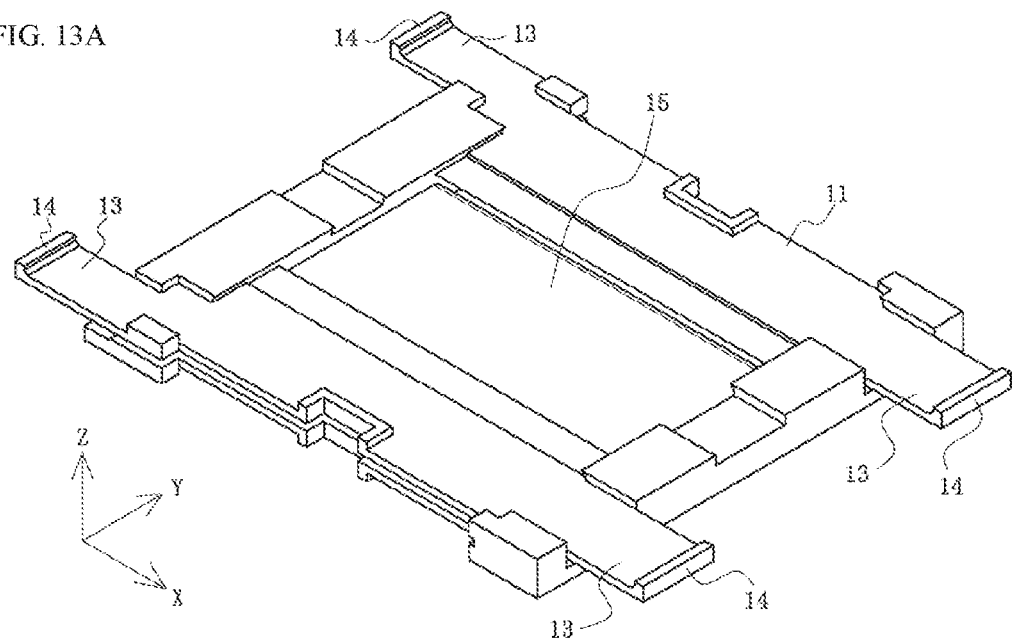
Figure 13B:
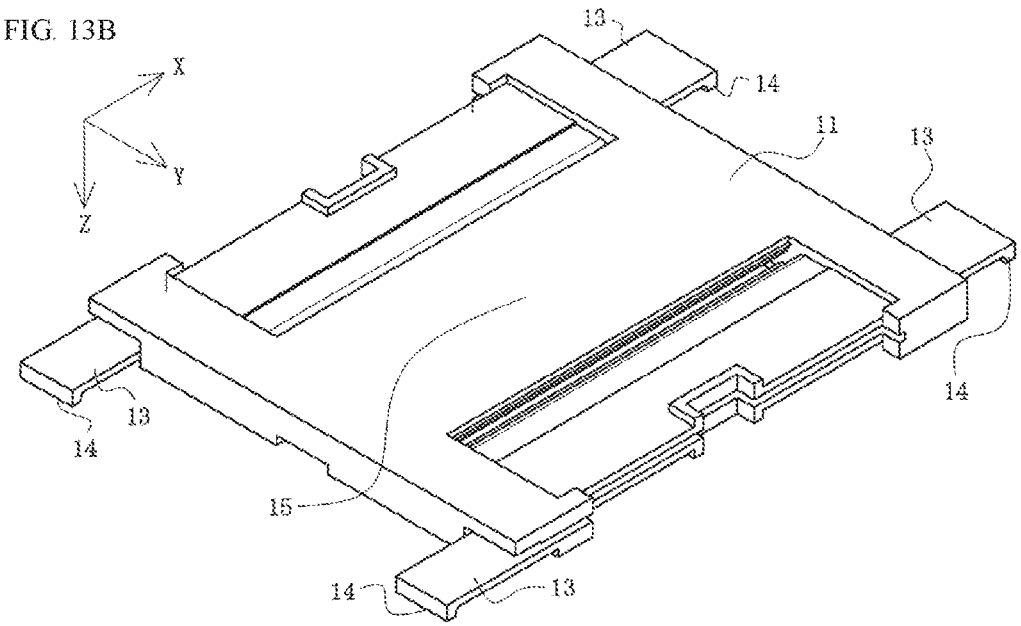
Figure 14A:
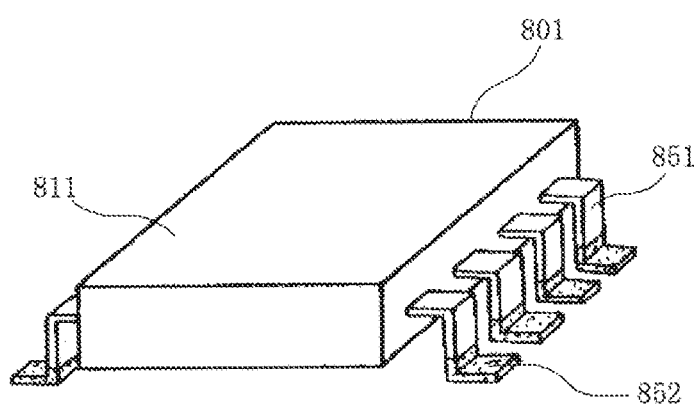
Figure 14B:
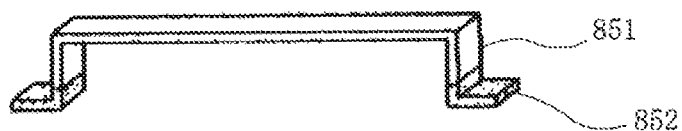

The electronic component 1 includes the adhesive sheet 31, the first conductive terminal 51, the second conductive terminal 61, and the second shell 71. As illustrated in FIGS. 7 and 8, these members are sequentially laminated in the order of the adhesive sheet 31, the first conductive terminal 51, the second conductive terminal 61, and the second shell 71 from above. In addition, a structure without the adhesive sheet 31 as illustrated in FIGS. 4A and 4B pasted thereon can be obtained by insert molding (overmolding) involving filling a molding die (not illustrated) with a material of the housing 11 such as synthetic resin, with a laminated body (having a structure as illustrated in FIGS. 12A and 12B and consisting of the first conductive terminal 51, the second conductive terminal 61, and the second shell 71) placed in this die. Further, by pasting the adhesive sheet 31 on this structure, the electronic component 1 as illustrated in FIGS. 1A and 1B can be obtained.

Figure 10A:
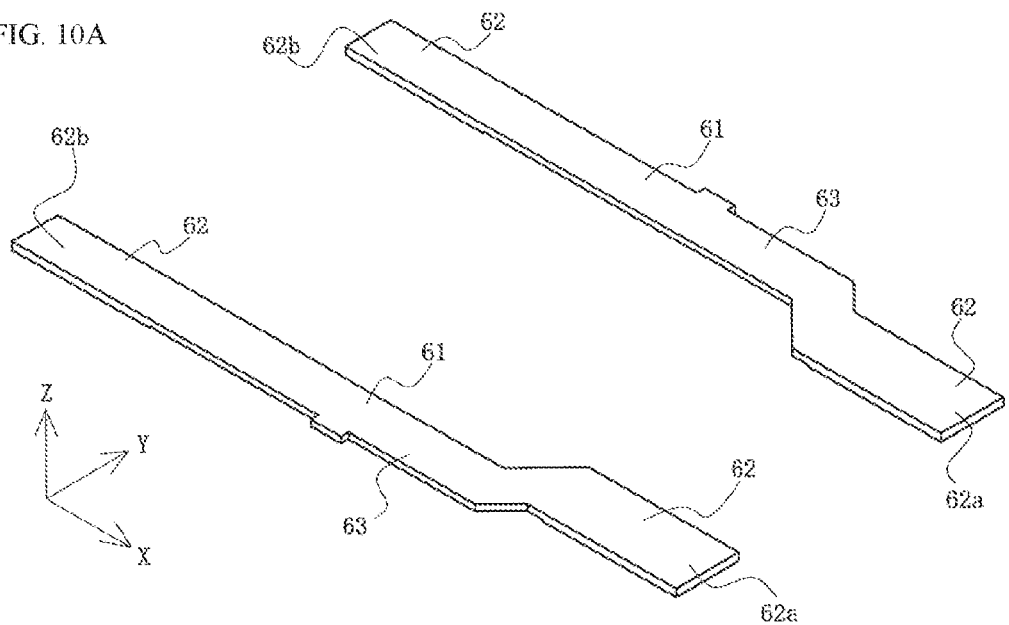
Figure 10B:
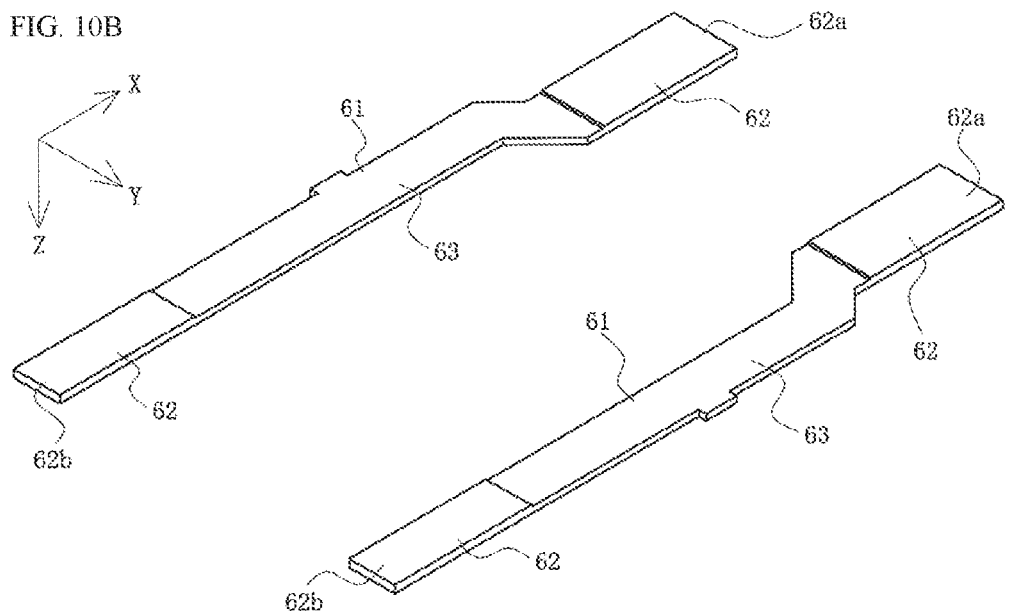
Figure 11A:
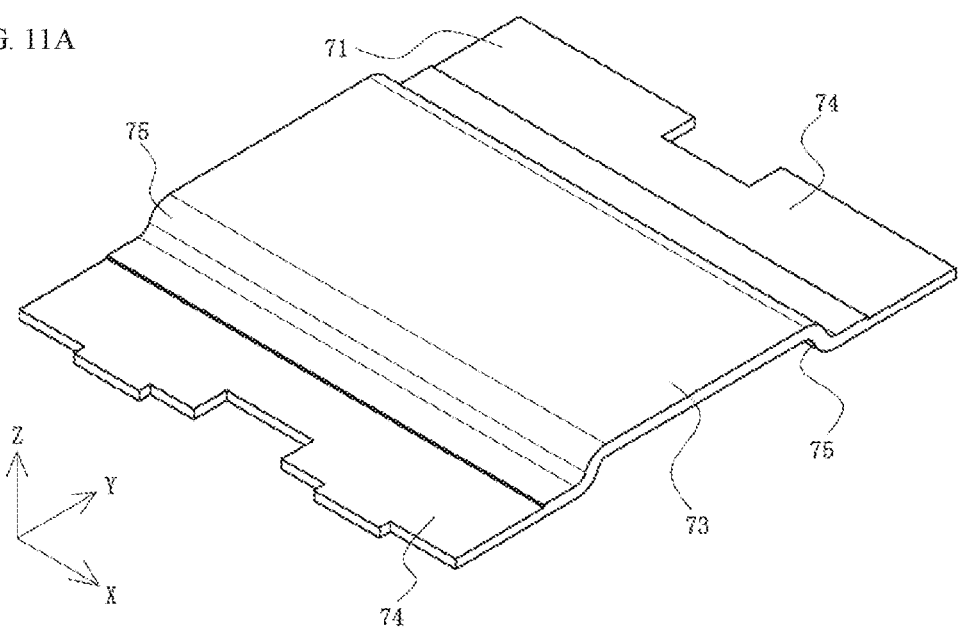
Figure 11B:
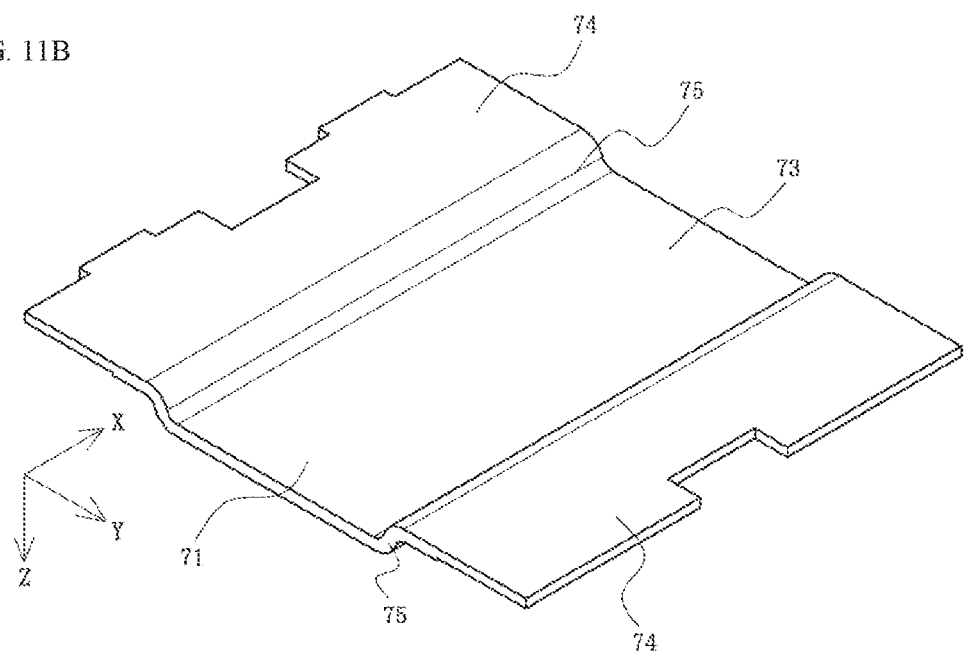

As illustrated in FIGS. 10A and 10B, the second conductive terminal 61 includes an elongated belt shaped main body 63 stretching in the longitudinal direction, with the second leg part 62 extending forward and backward from both the front and rear ends of this main body 63. Moreover, as illustrated in FIGS. 11A and 11B, the second shell 71 includes a flat plate shaped connecting part 73 as a projection, as well as shield parts 74 as a pair of flat plate shaped eaves parts connected to both ends of this connecting part 73 via a bent part 75 bent in a crank shape. Each shield part 74 is an elongated belt shaped part stretching in the longitudinal direction and is also set via the bent part 75 so as to lower the height position (position in the Z-axis direction) of the connecting part 73. Therefore, as illustrated in FIGS. 12A and 12B, when the first conductive terminal 51, the second conductive terminal 61, and the second shell 71 are laminated, although the upper surface of the connecting part 73 contacts the lower surface of the flat plate part 53 of the first conductive terminal 51 so as to be conductible therewith, the shield part 74 is separated from the vicinity on both the left and right sides of the flat plate part 53 without being in contact therewith.

In addition, the majority of the main body 63 of the second conductive terminal 61 is accommodated between the shield part 74 and the vicinity on both the left and right sides of the flat plate part 53, in the non-contact state between the shield part 74 and the flat plate part 53. While not limited thereto, both the interval between the upper surface of the main body 63 and the lower surface of the flat plate part 53 and the interval between the lower surface of the main body 63 and the upper surface of the shield part 74 are, for example, desirably approximately 0.04 [mm] and can be appropriately changed.

The laminated body configured as illustrated in FIGS. 12A and 12B is integrated with the housing 11, part of which is filled into the gaps thereof. Note that in FIGS. 7, 8, 13A and 13B, while the shape of the housing 11 is illustrated, it is actually not formed as a single body as the shape illustrated in FIGS. 6A and 6B, but rather molded so as to be integrated with the laminated body as illustrated in FIGS. 12A and 12B. The housing 11 protrudes from the longitudinal ends of this housing 11 and includes the protrusion plate 13 filled between the auxiliary leg part 57 of the first conductive terminal 51 and the second leg part 62 of the second conductive terminal 61, as well as the thick part 14 at the tip of this protrusion plate 13. Moreover, at least part of the housing 11 is present between the main body 63 of the second conductive terminal 61 and the shield part 74 of the second shell 71 or the flat plate part 53 of the first conductive terminal 51. Thereby, the non-contact state is assuredly maintained between the second conductive terminal 61 and the second shell 71 or the first conductive terminal 51.

Note that in a molding die used for the molding of the housing 11, considering that the housing 11 has a substantially rectangular parallelepiped plate shape, a gate (inlet) which is injected with a material such as heat resistant synthetic resin melt in the cavity of a die is generally formed at the position corresponding to the vicinity of the center of the lower surface of the bottom 15. Thus, when the distance (for the case in which a melt material injected from the gate flows in the cavity) is longest, the thick part 14 is disposed at the tip of the protrusion plate 13 extending in the longitudinal direction in the vicinity of the four corners of the housing 11. Therefore, if the complete molding of this thick part 14 is confirmed, all locations in the cavity can be said to be filled with a material, with the housing 11 completely molded.

Subsequently, one example of a method for manufacturing the electronic component 1 will be described.

First, in the first step, a metallic plate consisting of a copper alloy is pressed to form a desired shape, after which a predetermined part of a plate shaped member having this shape is plated to form a plating coating film of nickel or gold, etc. to obtain the first conductive terminal 51.

Moreover, in the second step, a metallic plate consisting of a copper alloy is pressed to form a desired shape, after which a predetermined part of a plate shaped member having this shape is plated to form a plating coating film of nickel or gold, etc. to obtain the second conductive terminal 61.

Further, in the third step, a metallic plate consisting of a copper alloy is pressed to form a desired shape, after which a predetermined part of a plate shaped member having this shape is plated to form a plating coating film of nickel or gold, etc. to obtain the second shell 71.

Subsequently, in the fourth step, the first conductive terminal 51, the second conductive terminal 61, and the second shell 71 obtained in the first to third steps are laminated so as to overlap each other and form the laminated body as illustrated in FIGS. 12A and 12B. In this case, the lower surface of the flat plate part 53 of the first conductive terminal 51 is brought into contact with the upper surface of the connecting part 73 of the second shell 71, with the first conductive terminal 51 conductible with the second shell 71. Note that, as required, in order to assuredly maintain mutual contact between the flat plate part 53 and the connecting part 73, they can also be joined by laser welding, etc.

Subsequently, in the fifth step, the laminated body obtained in the fourth step is placed in a molding die (not illustrated) and the die is filled with a melt material such as heat resistant synthetic resin to carry out insert molding, that is, overmolding. The material is filled into a space between the first conductive terminal 51, the second conductive terminal 61, and the second shell 71 so as to fill the space and configure the housing 11 to cover at least part of the lower surface of the connecting part 73 in the second shell 71, with the laminated body consequently integrated with the housing 11.

Subsequently, in the sixth step, a sheet consisting of an insulative adhesive material is cut into a desired shape to obtain the adhesive sheet 31, which is then pasted onto the upper surface of the flat plate part 53 of the first conductive terminal 51. Consequently, the electronic component 1 as illustrated in FIGS. 1A and 1B can be obtained.

In addition, inspection is carried out in the seventh step. In this inspection, via visual recognition from above the electronic component 1 by an inspector or via inspection of the image on the upper surface of the electronic component 1 using an imaging apparatus such as a camera, etc., the formation of all thick parts 14 is confirmed. Electronic components 1 with all thick parts 14 not completely formed are eliminated as defective products. Note that the seventh step can also be carried out before the sixth step.

As mentioned above, if the complete molding of this thick part 14 is confirmed, all locations in the cavity can be said to be filled with a material, with the housing 11 completely molded. In addition, as illustrated in FIGS. 2A, 2B, 5A and 5B, the thick part 14 is exposed on the upper surface. Moreover, in general, the appearance (such as color and gloss) of materials such as heat resistant synthetic resins serving as the material of the housing 11 has high identification performance clearly unlike metal, which is the material of the first conductive terminal 51 and the second conductive terminal 61. Therefore, both via visual inspection by an inspector and via image inspection using an imaging apparatus, only visual recognition and imaging from above the electronic component 1 make it possible to assuredly determine whether the thick part 14 has been completely molded without visual recognition or imaging from other directions, consequently making it possible to assuredly determine whether the housing 11 has been completely molded.

In this manner, because only visual recognition and imaging from above the electronic component 1 enable the assured determination of whether the housing 11 has been completely molded, for example, even when, as in the transportation step of multiple electronic components 1, etc., the interval between adjacent electronic components 1 is narrow, and visual recognition or imaging from the lateral direction and the oblique direction is difficult, the electronic components 1 can be assuredly and easily inspected.

In this manner, in the present embodiment, the electronic component 1 includes the first conductive terminal 51 and the second conductive terminal 61 as multiple conductive terminals, as well as the housing 11 integrated with the first conductive terminal 51 and the second conductive terminal 61, the auxiliary leg part 57 possessed by the first conductive terminal 51 serving as one of the conductive terminals and the second leg part 62 possessed by the second conductive terminal 61 serving as another one of the conductive terminals are disposed so as to vertically overlap each other, the auxiliary leg part 57 possessed by the first conductive terminal 51 and the second leg part 62 possessed by the second conductive terminal 61 have different lengths, and the tip of the shorter auxiliary leg part 57 of the two is covered by the thick part 14 of the housing 11.

Consequently, the tip of the auxiliary leg part 57 is prevented from being damaged and even when the electronic component is miniaturized, desired performance can be reliably exhibited, with the reliability and durability improved. Moreover, because the presence of the thick part 14 enables the assured determination of whether the housing 11 has been completely molded, the electronic component 1 can be assuredly and easily inspected, with the manufacturing cost reduced.

Moreover, the protrusion plate 13 of the housing 11 is disposed between the auxiliary leg part 57 and the second leg part 62, which are disposed so as to vertically overlap each other, with the thick part 14 formed at the tip of the protrusion plate 13. Therefore, because the auxiliary leg part 57 and the second leg part 62 are integrated with the protrusion plate 13, strength is improved.

Further, one of the conductive terminals is the first conductive terminal 51 and the first conductive terminal 51 includes the flat plate part 53 as well as multiple auxiliary leg parts 57 extending forward and backward from the flat plate part 53, while another one of the conductive terminals is the second conductive terminal 61 and includes the main body 63 as well as multiple second leg parts 62 extending forward and backward from the main body 63, with at least part of the main body 63 and the flat plate part 53 disposed so as to vertically overlap each other. Further, the first conductive terminal 51 includes multiple first leg parts 52 extending forward and backward from the flat plate part 53, with the first leg parts 52 connected to a ground wire. Therefore, the first conductive terminal 51 functions as an EMI shield member for electromagnetically effectively shielding the electronic component 1.

Further, the electronic component 1 further includes the second shell 71 integrated with the housing 11, the second shell 71 includes the connecting part 73 and the shield part 74, the connecting part 73 contacts the flat plate part 53, and at least part of the main body 63 is disposed on the shield part 74 on the opposite side of the flat plate part 53 from the main body 63 so as to vertically overlap each other. Further, at least part of the housing 11 is present between the main body 63 and the flat plate part 53, and between the main body 63 and the shield part 74. Therefore, the second conductive terminal 61 is electromagnetically effectively shielded from both sides.

Note that the present disclosure is only one example, with any appropriate changes that preserve the gist of the present disclosure and can easily be conceived by a person skilled in the art being within the scope of the present disclosure. The widths, thicknesses, and shapes of the portions illustrated in the drawing are schematically illustrated and not intended to limit the interpretation of the present disclosure.

Moreover, the disclosure of the present specification describes characteristics related to preferred and exemplary embodiments. Various other embodiments, modifications and variations within the scope and spirit of the claims appended hereto could naturally be conceived of by persons skilled in the art by summarizing the disclosures of the present specification.

The present disclosure can be applied to an electronic component.

The invention claimed is:

1. An electronic component comprising:
   multiple conductive terminals; and
   an insulator integrated with the conductive terminals,
   wherein a leg part possessed by one of the conductive terminals and a leg part possessed by another one of the conductive terminals are disposed so as to vertically overlap each other, the leg part possessed by one of the conductive terminals and the leg part possessed by another one of the conductive terminals have different lengths, and a tip of the shorter leg part of the two is covered by a thick part of the insulator, and
   wherein one of the conductive terminals is a first conductive terminal, the first conductive terminal including a flat plate part, as well as auxiliary leg parts serving as a plurality of shorter leg parts of the two extending forward and backward from the flat plate part, wherein another one of the conductive terminals is a second conductive terminal and includes a main body, as well as multiple leg parts extending forward and backward from the main body, wherein at least part of the main body and the flat plate part are disposed so as to vertically overlap each other, and
   wherein the first conductive terminal includes multiple first leg parts extending forward and backward from the flat plate part, with the multiple first leg parts configured to be connected to a ground wire.

2. The electronic component according to claim 1, wherein a protrusion plate of the insulator is disposed between the leg parts which are disposed so as to vertically overlap each other, with the thick part formed at the tip of the protrusion plate.

3. The electronic component according to claim 1, further comprising: a conductive plate integrated with the insulator, wherein the conductive plate includes a projection and an eaves part, the projection contacts the flat plate part, at least part of the main body is disposed on the eaves part on the opposite side of the flat plate part from the main body so as to vertically overlap the flat plate part.

4. The electronic component according to claim 3, wherein at least part of the insulator is present between the main body and the flat plate part, and between the main body and the eaves part.

5. An electronic component comprising:
   a housing having a protrusion plate extending from an end thereof, the protrusion plate having a thick part formed at a tip thereof;
   a first conductive terminal that is integrally formed with the housing, the first conductive terminal having a flat plate part, a first leg part extending from the flat plate part, and an auxiliary leg part extending from the flat plate part, the first leg part and the auxiliary leg part being separated from each other, the first leg part being configured to be connected to a first portion of a substrate, the auxiliary leg part having a first length; and
   a second conductive terminal that is integrally formed with the housing, the second conductive terminal having a second leg part, the second leg part having a second length, the second length being greater than the first length, the second leg part being configured to be connected to a second portion of the substrate;
   wherein the protrusion plate is positioned between the auxiliary leg part and the second leg part and the thick part of the protrusion plate covers a tip of the auxiliary leg part.

6. The electronic component as defined in claim 5, wherein the auxiliary leg part comprises first and second auxiliary leg parts, and wherein the second leg part comprises first and second second leg parts, and wherein the protrusion plate comprises first and second protrusion plates, and wherein the first protrusion plate is positioned between the first auxiliary leg part and the first second leg part and the thick part of the first protrusion plate covers a tip of the first auxiliary leg part, and wherein the second protrusion plate is positioned between the second auxiliary leg part and the second second leg part and the thick part of the second protrusion plate covers a tip of the second auxiliary leg part.

7. The electronic component as defined in claim 6, wherein the first leg part is positioned between the first and second auxiliary leg parts of the first conductive terminal.

8. The electronic component as defined in claim 5, further comprising a conductive plate that is integrally formed with the housing, the conductive plate having a projection, the projection contacting the flat plate part of the first conductive terminal, the conductive plate being electrically isolated from the second conductive terminal.

9. An electronic component comprising:
a housing having a protrusion plate extending from an end thereof;
a first conductive terminal that is integrally formed with the housing, the first conductive terminal having a flat plate part and an auxiliary leg part extending from the flat plate part, the auxiliary leg part having a first length;
a second conductive terminal that is integrally formed with the housing, the second conductive terminal having a leg part, the leg part having a second length, the second length being greater than the first length; and
a conductive plate that is integrally formed with the housing, the conductive plate having a projection, the projection contacting the flat plate part of the first conductive terminal, the conductive plate being electrically isolated from the second conductive terminal,
wherein the protrusion plate is positioned between the auxiliary leg part and the leg part of the second conductive terminal.

* * * * *